(12) United States Patent
Maleki et al.

(10) Patent No.: US 7,630,417 B1
(45) Date of Patent: Dec. 8, 2009

(54) CRYSTAL WHISPERING GALLERY MODE OPTICAL RESONATORS

(75) Inventors: Lutfollah Maleki, Pasadena, CA (US); Andrey B. Matsko, Pasadena, CA (US); Anatoliy Savchenkov, La Crescenta, CA (US); Dmitry V. Strekalov, Arcadia, CA (US)

(73) Assignee: California Institute of Technology, Pasadena, CA (US)

( * ) Notice: Subject to any disclaimer, the term of this patent is extended or adjusted under 35 U.S.C. 154(b) by 96 days.

(21) Appl. No.: 11/166,355

(22) Filed: Jun. 24, 2005

Related U.S. Application Data (60) Provisional application No. 60/582,883, filed on Jun. 24, 2004.

(51) Int. Cl.
*H01S 3/10* (2006.01)

(52) U.S. Cl. .............. 372/20; 250/227.11; 372/21; 372/32; 359/239; 359/245; 359/247; 359/330; 331/42; 331/43; 331/96; 385/5; 385/6; 385/8; 385/14; 385/15; 385/27; 385/28; 385/29; 385/30; 385/31

(58) Field of Classification Search ............ 250/227.11; 359/239, 245, 247, 330; 372/20, 21, 32; 331/42, 43, 96; 385/5, 6, 8, 14, 15, 27–31
See application file for complete search history.

(56) References Cited

U.S. PATENT DOCUMENTS

| | | | |
|---|---|---|---|
| 5,204,640 A | 4/1993 | Logan, Jr. | |
| 5,220,292 A | 6/1993 | Bianchini et al. | |
| 5,723,856 A | 3/1998 | Yao et al. | |
| 5,751,747 A | 5/1998 | Lutes et al. | |
| 5,777,778 A | 7/1998 | Yao | |
| 5,917,179 A | 6/1999 | Yao | |
| 5,929,430 A | 7/1999 | Yao et al. | |
| 5,985,166 A | 11/1999 | Unger et al. | |
| 6,080,586 A | 6/2000 | Baldeschwieler et al. | |
| 6,178,036 B1 | 1/2001 | Yao | |
| 6,203,660 B1 | 3/2001 | Unger et al. | |
| 6,389,197 B1 | 5/2002 | Iltchenko et al. | |
| 6,417,957 B1 | 7/2002 | Yao | |
| 6,473,218 B1 | 10/2002 | Maleki et al. | |
| 6,476,959 B2 | 11/2002 | Yao | |
| 6,487,233 B2 | 11/2002 | Maleki et al. | |
| 6,488,861 B2 | 12/2002 | Iltchenko et al. | |
| 6,490,039 B2 * | 12/2002 | Maleki et al. ............... | 356/436 |

(Continued)

FOREIGN PATENT DOCUMENTS

WO 01/96936 12/2001

(Continued)

OTHER PUBLICATIONS

"Stimulated Emission into Optical Whispering Modes of Spheres," by Garrett, et al., Physical Review, V 124, No. 6, pp. 1807-1811(1961).*

(Continued)

*Primary Examiner*—Wael Fahmy
*Assistant Examiner*—Hrayr A Sayadian
(74) *Attorney, Agent, or Firm*—Fish & Richardson P.C.

(57) ABSTRACT

Whispering-gallery-mode (WGM) optical resonators made of crystal materials to achieve high quality factors at or above $10^{10}$.

5 Claims, 9 Drawing Sheets

U.S. PATENT DOCUMENTS

| | | | |
|---|---|---|---|
| 6,535,328 | B2 | 3/2003 | Yao |
| 6,567,436 | B1 | 5/2003 | Yao et al. |
| 6,580,532 | B1 | 6/2003 | Yao et al. |
| 6,594,061 | B2 | 7/2003 | Huang et al. |
| 6,668,111 | B2 * | 12/2003 | Tapalian et al. ............... 385/28 |
| 6,762,869 | B2 * | 7/2004 | Maleki et al. ............... 359/239 |
| 6,795,481 | B2 | 9/2004 | Maleki et al. |
| 6,798,947 | B2 | 9/2004 | Iltchenko |
| 6,853,479 | B1 | 2/2005 | Ilchenko et al. |
| 6,871,025 | B2 | 3/2005 | Maleki et al. |
| 6,873,631 | B2 | 3/2005 | Yao et al. |
| 6,879,752 | B1 | 4/2005 | Ilchenko et al. |
| 6,901,189 | B1 | 5/2005 | Savchenkov et al. |
| 6,906,309 | B2 | 6/2005 | Sayyah et al. |
| 6,922,497 | B1 | 7/2005 | Savchenkov et al. |
| 6,928,091 | B1 | 8/2005 | Maleki et al. |
| 6,943,934 | B1 | 9/2005 | Ilchenko et al. |
| 6,987,914 | B2 | 1/2006 | Savchenkov et al. |
| 7,024,069 | B2 | 4/2006 | Savchenkov et al. |
| 7,043,117 | B2 | 5/2006 | Matsko et al. |
| 7,050,212 | B2 | 5/2006 | Matsko et al. |
| 7,061,335 | B2 | 6/2006 | Maleki et al. |
| 7,062,131 | B2 | 6/2006 | Ilchenko |
| 7,092,591 | B2 | 8/2006 | Savchenkov et al. |
| 7,133,180 | B2 | 11/2006 | Ilchenko et al. |
| 7,173,749 | B2 | 2/2007 | Maleki et al. |
| 7,184,451 | B2 | 2/2007 | Ilchenko et al. |
| 7,187,870 | B2 | 3/2007 | Ilchenko et al. |
| 7,218,662 | B1 | 5/2007 | Ilchenko et al. |
| 7,248,763 | B1 | 7/2007 | Kossakovski et al. |
| 7,260,279 | B2 | 8/2007 | Gunn et al. |
| 7,283,707 | B1 | 10/2007 | Maleki et al. |
| 7,369,722 | B2 | 5/2008 | Yilmaz et al. |
| 7,389,053 | B1 | 6/2008 | Ilchenko et al. |
| 7,400,796 | B1 | 7/2008 | Kossakovski et al. |
| 7,440,651 | B1 | 10/2008 | Savchenkov et al. |
| 7,460,746 | B2 | 12/2008 | Maleki et al. |
| 2001/0038651 | A1 | 11/2001 | Maleki et al. |
| 2002/0018611 | A1 | 2/2002 | Maleki et al. |
| 2002/0018617 | A1 | 2/2002 | Iltchenko et al. |
| 2002/0021765 | A1 | 2/2002 | Maleki et al. |
| 2002/0081055 | A1 | 6/2002 | Painter et al. |
| 2002/0085266 | A1 | 7/2002 | Yao |
| 2002/0097401 | A1 | 7/2002 | Maleki et al. |
| 2002/0172457 | A1 * | 11/2002 | Tapalian et al. ............... 385/30 |
| 2003/0160148 | A1 | 8/2003 | Yao et al. |
| 2003/0206693 | A1 * | 11/2003 | Tapalian et al. ............... 385/28 |
| 2004/0023396 | A1 * | 2/2004 | Boyd et al. ............... 435/872 |
| 2004/0100675 | A1 | 5/2004 | Matsko et al. |
| 2004/0109217 | A1 * | 6/2004 | Maleki et al. ............... 359/239 |
| 2004/0184711 | A1 * | 9/2004 | Bradley et al. ............... 385/16 |
| 2004/0218880 | A1 | 11/2004 | Matsko et al. |
| 2004/0240781 | A1 | 12/2004 | Savchenkov et al. |
| 2005/0017816 | A1 | 1/2005 | Ilchenko et al. |
| 2005/0063034 | A1 | 3/2005 | Maleki et al. |
| 2005/0074200 | A1 | 4/2005 | Savchenkov et al. |
| 2005/0123306 | A1 | 6/2005 | Ilchenko et al. |
| 2005/0128566 | A1 | 6/2005 | Savchenkov et al. |
| 2005/0175358 | A1 | 8/2005 | Ilchenko et al. |
| 2005/0248823 | A1 | 11/2005 | Maleki et al. |
| 2006/0193557 | A1 * | 8/2006 | Bradley et al. ............... 385/32 |
| 2007/0009205 | A1 | 1/2007 | Maleki et al. |
| 2007/0153289 | A1 | 7/2007 | Yilmaz et al. |
| 2008/0001062 | A1 | 1/2008 | Gunn et al. |
| 2008/0075464 | A1 | 3/2008 | Maleki et al. |
| 2008/0310463 | A1 | 12/2008 | Maleki et al. |

FOREIGN PATENT DOCUMENTS

| | | |
|---|---|---|
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Armani, D.K., et al., "Ultra-High-Q Toroid Microcavity on a Chip", *Nature*, vol. 421, pp. 925-928, Feb. 2003.

Bar-Joseph, I., et al., "Parametric interaction of a modulated wave in a single-mode fiber", *Optics Letters*, 11(8):534-536, Aug. 1986.

Benabid, F., et al., "Rayleigh scattering in sapphire test mass for laser interferometric gravitational-wave detectors I. Measurement of scattering attenuation coefficient", *Optics Communications*, vol. 167, pp. 7-13, Aug. 1999.

Bigelow, M.S., et al., "Observation of Ultraslow Light Propagation in a Ruby Crystal at Room Temperature", *Physical Review Letters*, 90(11):113903(1-4), Mar. 2003.

Boyd, R.W., et al., *Progress in Optics*, vol. 43, pp. 497-530, (2002).

Braginsky, M.L., et al., "Quality-Factor and Nonlinear Properties of Optical Whispering-Gallery Modes", *Physics Letters A*, 137(7,8):393-397, May 1989.

Collot, L., et al., "Very High-Q Whispering-Gallery Mode Resonances Observed on Fused Silica Microspheres", *Europhysics Letters*, 23(5):327-334, Aug. 1993.

Datsyuk, V.V., et al., "Optics of microdroplets", *Physics-Uspekhi*, 44(10):1061-1073, Oct. 2001.

Fomin, A.E., et al., "Nonstationary nonlinear effects in optical microspheres", *Laser Resonators and Beam Control VII, Proc. SPIE*, vol. 5333, pp. 231-239, (2004).

Gee, A.R., et al., "Raman scattering and fluorescence in calcium fluoride", *Solid State Communications*, 4(1):43-46, (1965).

Gorodetsky, M.L., et al., "Rayleigh scattering in high-Q microspheres", *J. Opt. Soc. Am. B*, 17(6):1051-1057, Jun. 2000.

Gorodetsky, M.L., et al., "Ultimate Q of optical microsphere resonators", *Optics Letters*, 21(7):453-455, Apr. 1996.

Ilchenko, V.S., et al., "Nonlinear Optics and Crystalline Whispering Gallery Mode Cavities", *Physical Review Letters*, 92(4):043903(1-4), Jan. 2004.

Ilchenko, V.S., et al., "Sub-Micro Watt Photonic Microwave Receiver", *IEEE Photonics Technology Letters*, 14(11):1602-1604, Nov. 2002.

Ilchenko, V.S., et al., "Thermal Nonlinear Effects in Optical Whispering Gallery Microresonators", *Laser Physics*, 2(6):1004-1009, Nov. 1992.

Ito, H., et al., "InP/InGaAs Uni-Travelling-Carrier Photodiode with 310 GHz Bandwidth", *Electronics Letters*, 36(21):1809-1810, Oct. 2000.

Levenson, M.D., et al., "Dispersion of the nonlinear optical susceptibility tensor in centrosymmetric media", *Physical Review B*, 10(10):4447-4463, Nov. 1974.

Lin, H.-B., et al., "cw Nonlinear Optics in Droplet Microcavities Displaying Enhanced Gain", *Physical Review Letters*, 73(18):2440-2443, Oct. 1994.

Liu, C., et al., "Observation of Coherent Optical Information Storage in an Atomic Medium Using Halted Light Pulses", *Nature*, vol. 409, pp. 490-493, Jan. 2001.

Logan, et al., "Stabilization of Oscillator Phase Using a Fiber-Optic Delay-Line", *IEEE 45th Annual Symposium on Frequency Control*, pp. 508-512 (1991).

Logunov, S., et al., "Scattering losses in fused silica and $CaF_2$ for DUV applications", *Optical Microlithography XVI, Proc. SPIE*, vol. 5040, pp. 1396-1407, (2003).

Maleki, L., et al.. "Tunable delay line with interacting whispering-gallery-mode resonators", *Optics Letters*, 29(6):626-628, Mar. 2004.

Malitson, I.H., "A Redetermination of Some Optical Properties of Calcium Fluoride", *Applied Optics*, 2(11):1103-1107, Nov. 1963.

Matsko, A., et al., "High Frequency Photonic Microwave Oscillators Based on WGM Resonators", *2005 Digest of the LEOS Summer Topical Meetings*, pp. 113-114, Jul. 2005.

Matsko, A., et al., "Optical hyperparametric oscillations in a whispering-gallery-mode resonator: Threshold and phase diffusion", *Physical Review A*, 71(3):033814(1-10), Mar. 2005.

Matsko, A., et al., "Phase Diffusion of Hyper-Parametric Oscillations in a Nonlinear Whispering Gallery Mode Resonator", NASA Center—Jet Propulsion Laboratories, *Laser Resonators and Beam Control VIII*, 17 pages, Jan. 2005.

Matsko, A.B., et al., *Advances in Atomic Molecular and Optical Physics*, "Slow, Ultraslow, Stored, and Frozen Light", Academic Press, vol. 46, pp. 191-242, (2001).

Myers, L.E., et al., "Quasi-Phase-Matched Optical Parametric Oscillators in Bulk Periodically Poled $LiNbO_3$", *J. Opt. Soc. Am. B*, 12(11):2102-2116, Nov. 1995.

Nubling, R.K., et. al., "Optical properties of single-crystal sapphire fibers", *Applied Optics*, 36(24):5934-5940, Aug. 1997.

Oraevsky, A.N., "Whispering-gallery waves", *Quantum Electronics*, 32(5):377-400, Jan. 2002.

Phillips, D.F., et al., "Storage of Light in Atomic Vapor", *Physical Review Letters*, 86(5):783-786, Jan. 2001.

Savchenkov, A., et al., "Kilohertz Optical Resonances in Dielectric Crystal Cavities", *Physical Review A*, vol. 70(5):051804(1-4), Nov. 2004.

Savchenkov, A., et al., "Low Threshold Optical Oscillations in a Whispering Gallery Mode $CaF_2$ Resonator", *Physical Review Letters*, 93(24):243905(1-4), Dec. 2004.

Spillane, S.M., et al., "Ultralow-Threshold Raman Laser Using a Spherical Dielectric Microcavity", *Nature*, vol. 415, pp. 621-623, Feb. 2002.

Vahala, K.J., "Optical Microcavities", *Nature*, vol. 424, pp. 839-846, Aug. 2003.

Vernooy, D.W., et al., "High-Q measurements of fused-silica microspheres in the near infrared", *Optics Letters*, 23(4):247-249, Feb. 1998.

Willamowski, U , et al., "Measuring the absolute absorptance of optical laser components", *Applied Optics*, 37(36):8362-8370, Dec. 1998.

Yanik, M.F., et al., "Stopping Light All Optically", *Physical Review Letters*, 92(8):083901(1-4), Feb. 2004.

Yao, X. Steve, et al., "Converting Light into Spectrally Pure Microwave Oscillation", *Optics Letters*, 21(7):483-485, Apr. 1996.

Zibrov, A.S., et al., "Nondegenerate Parametric Self-Oscillation via Multiwave Mixing in Coherent Atomic Media", *Physical Review Letters*, 83(20):4049-4052, Nov. 1999.

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J.Opt. Soc. Am. B*, 16(1):147-154, Jan. 1999.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V.S., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V.S., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V.S., et al., "Microsphere Integration in Active and Passive Photonics Devices," *Proc. of SPIE Laser Resonators III*, vol. 3930, pp. 154-162, Jan. 2000.

Ilchenko, V.S., et al., "Microtorus: A High-Finesse Microcavity with Whispering-Gallery Modes," *Optics Letters*, 26(5):256-258, Mar. 2001.

Ilchenko, V.S., et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V.S., et al., "Tunability and Synthetic Lineshapes in High-Q Optical Whispering Gallery Modes," *Proc. of SPIE Laser Resonators and Beam Control VI*, vol. 4969, pp. 195-206, Jan. 2003.

Ilchenko, V.S., et al., "Whispering-Gallery-Mode Electro-Optic Modulator and Photonic Microwave Receiver," *J. Opt. Soc. Am. B*, 20(2):333-342, Feb. 2003.

Maleki, L., "The Opto-Electronic Oscillator: Prospects for Extending the State of the Art in Reference Frequency Generation," *International Topical Meeting on Microwave Photonics*, pp. 195- 198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A. et al. "Whispering-Gallery-Mode Resonators as Frequency References. I. Fundamental Limitations," *J. Opt. Soc. Am. B*, 24(6):1324-1335, Jun. 2007.

Savchenkov, A., et al., "Whispering-Gallery-Mode Resonators as Frequency References. II. Stabilization," *J. Opt. Soc. Am. B*, 24(12): 2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report 42-122*, pp. 32-43, Aug. 1995.

Yao, X.S., et al., "Coupled Optoelectronic Oscillators for Generating Both RF Signal and Optical Pulses," *Journal of Lightwave Technology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

\* cited by examiner

FIG. 15 splitting a laser beam from a laser into a first laser beam into a first optical arm of a Mach-Zehnder interferometer and a second laser beam into a second optical arm of the Mach-Zehnder interferometer inserting a whispering-gallery-mode resonator formed of a fluorite crystal material in the first optical arm of the Mach-Zehnder interferometer to receive the first laser beam from an input end of the first optical arm and to output a filtered first laser beam to an output end of the first optical arm combining the filtered first laser beam and the second laser beam to produce a combined beam as an output of the Mach-Zehnder interferometer converting the combined beam into a detector signal to observe an optical hyperparametric oscillation caused by a nonlinear mixing in the resonator

FIG. 16

CRYSTAL WHISPERING GALLERY MODE OPTICAL RESONATORS

This application claims the benefit of U.S. Provisional Patent Application Ser. No. 60/582,883 entitled "Hyper-Parametric Optical Oscillator with Crystalline Whispering Gallery Mode Resonators" and filed Jun. 24, 2004, the entire disclosure of which is incorporated herein by reference as part of the specification of this application.

FEDERALLY SPONSORED RESEARCH OR DEVELOPMENT

The invention described herein was made in the performance of work under a NASA contract, and is subject to the provisions of Public Law 96-517 (35 USC 202) in which the Contractor has elected to retain title.

BACKGROUND

This application relates to whispering gallery mode (WGM) resonators and their applications.

The optical resonators may be configured as optical whispering-gallery-mode ("WGM") resonators which support a special set of resonator modes known as whispering gallery ("WG") modes. These WG modes represent optical fields confined in an interior region close to the surface of the resonator due to the total internal reflection at the boundary. For example, a dielectric sphere may be used to form a WGM resonator where WGM modes represent optical fields confined in an interior region close to the surface of the sphere around its equator due to the total internal reflection at the sphere boundary. Quartz microspheres with diameters on the order of $10$~$10^2$ microns have been used to form compact optical resonators with Q values greater than $10^9$. Such hi-Q WGM resonators may be used to produce oscillation signals with high spectral purity and low noise. Optical energy, once coupled into a whispering gallery mode, can circulate at or near the sphere equator over a long photon life time.

SUMMARY

This application describes crystal WGM resonators with high quality factors at or above $10^{10}$. Optical hyperparametric oscillations caused by nonlinear wave mixing can be achieved and observed from such resonators at low thresholds.

In one implementation, a laser beam from a laser is split into a first laser beam into a first optical arm of a Mach-Zehnder interferometer and a second laser beam into a second optical arm of the Mach-Zehnder interferometer. A whispering-gallery-mode resonator formed of a fluorite crystal material is inserted in the first optical arm of the Mach-Zehnder interferometer to receive the first laser beam from an input end of the first optical arm and to output a filtered first laser beam to an output end of the first optical arm. The filtered first laser beam and the second laser beam are combined to produce a combined beam as an output of the Mach-Zehnder interferometer. The combined beam is converted into a detector signal to observe an optical hyperparametric oscillation caused by a nonlinear mixing in the resonator.

In addition, the laser may be a tunable laser. Therefore, a portion of the combined beam can be converted into an electrical signal. A DC portion of the electrical signal is then used as a frequency error signal of the laser to control the laser to lock the laser to a whispering gallery mode of the resonator.

These and other features are described in greater detail in the attached drawings, the detailed description and the claims.

DETAILED DESCRIPTION

WGM resonators made of crystals described in this application can be optically superior than WGM resonators made of fused silica. WGM resonators made of crystalline $CaF_2$ can produce a Q factor at or greater than $10^{10}$. Such a high Q value allows for various applications, including generation of kilohertz optical resonances and low-threshold optical hyperparametric oscillations due to the Kerr nonlinear effect.

The following sections first describe the exemplary geometries for crystal WGM resonators and then describe the properties of WGM resonators made of different materials.

Figure 1:
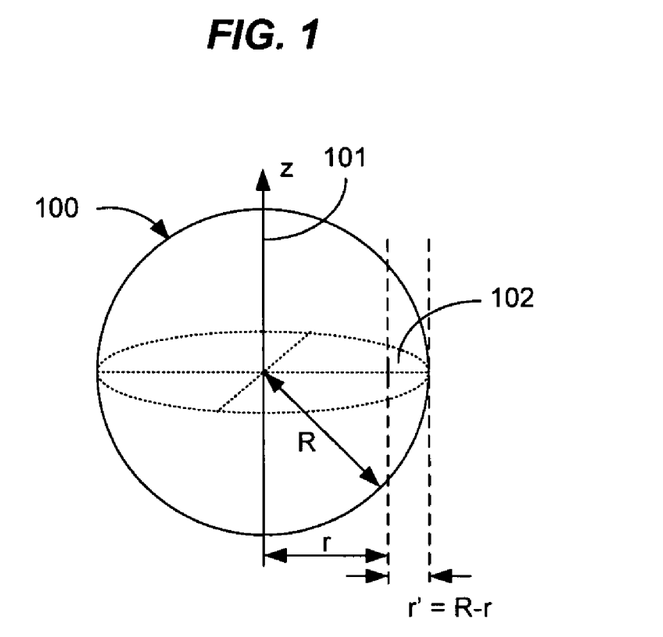
FIGS. 1, 2, 3, 4A, and 4B illustrate various exemplary resonator configurations that support whispering gallery modes.
Figure 2:
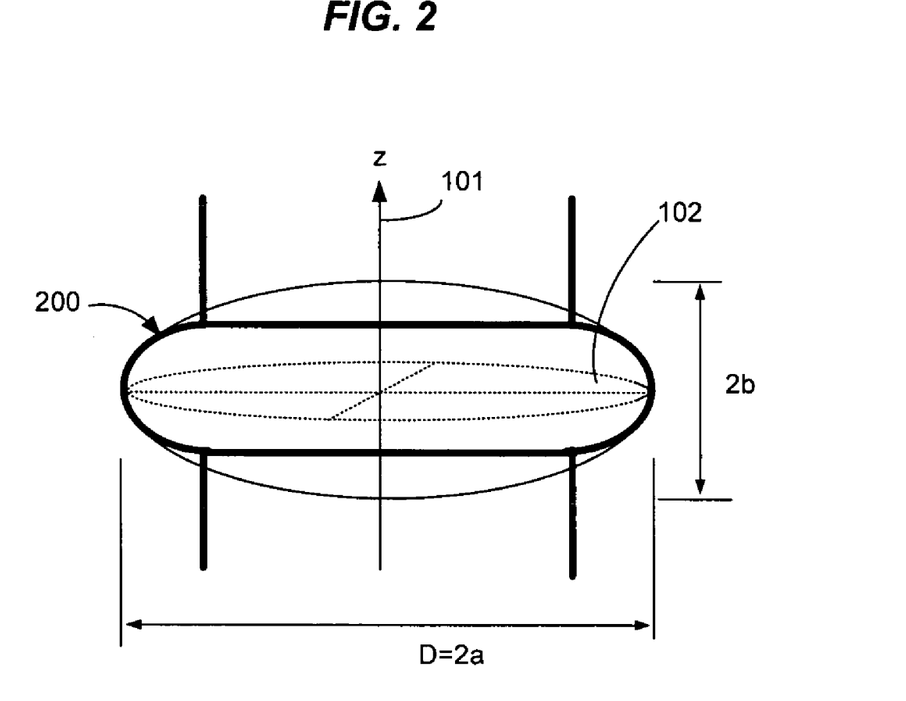
Figure 3:
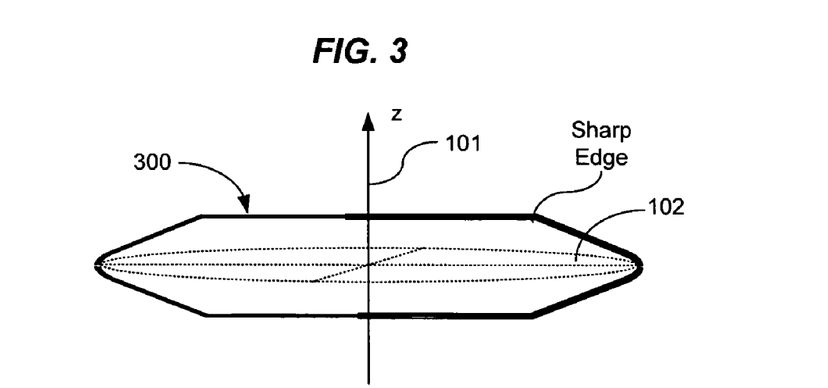

FIGS. 1, 2, and 3 illustrate three exemplary WGM resonators. FIG. 1 shows a spherical WGM resonator 100 which is a solid dielectric sphere. The sphere 100 has an equator in the plane 102 which is symmetric around the z axis 101. The circumference of the plane 102 is a circle and the plane 102 is a circular cross section. A WG mode exists around the equator within the spherical exterior surface and circulates within the resonator 100. The spherical curvature of the exterior surface around the equator plane 102 provides spatial confinement along both the z direction and its perpendicular direction to support the WG modes. The eccentricity of the sphere 100 generally is low.

FIG. 2 shows an exemplary spheroidal microresonator 200. This resonator 200 may be formed by revolving an ellipse (with axial lengths a and b) around the symmetric axis along the short elliptical axis 101 ($z$). Therefore, similar to the spherical resonator in FIG. 1, the plane 102 in FIG. 2 also has a circular circumference and is a circular cross section. Different from the design in FIG. 1, the plane 102 in FIG. 2 is a circular cross section of the non-spherical spheroid and around the short ellipsoid axis of the spheroid. The eccentricity of resonator 100 is $(1-b^2/a^2)^{1/2}$ and is generally high, e.g., greater than $10^{-1}$. Hence, the exterior surface is the resonator 200 is not part of a sphere and provides more spatial confinement on the modes along the z direction than a spherical exterior. More specifically, the geometry of the cavity in the plane in which Z lies such as the zy or zx plane is elliptical. The equator plane 102 at the center of the resonator 200 is perpendicular to the axis 101 ($z$) and the WG modes circulate near the circumference of the plane 102 within the resonator 200.

FIG. 3 shows another exemplary WGM resonator 300 which has a non-spherical exterior where the exterior profile is a general conic shape which can be mathematically represented by a quadratic equation of the Cartesian coordinates. Similar to the geometries in FIGS. 1 and 2, the exterior surface provides curvatures in both the direction in the plane 102 and the direction of z perpendicular to the plane 102 to confine and support the WG modes. Such a non-spherical, non-elliptical surface may be, among others, a parabola or hyperbola. Note that the plane 102 in FIG. 3 is a circular cross section and a WG mode circulates around the circle in the equator.

The above three exemplary geometries in FIGS. 1, 2, and 3 share a common geometrical feature that they are all axially or cylindrically symmetric around the axis 101 ($z$) around which the WG modes circulate in the plane 102. The curved exterior surface is smooth around the plane 102 and provides two-dimensional confinement around the plane 102 to support the WG modes.

Notably, the spatial extent of the WG modes in each resonator along the z direction 101 is limited above and below the plane 102 and hence it may not be necessary to have the entirety of the sphere 100, the spheroid 200, or the conical shape 300. Instead, only a portion of the entire shape around the plane 102 that is sufficiently large to support the whispering gallery modes may be used to form the WGM resonator. For example, rings, disks and other geometries formed from a proper section of a sphere may be used as a spherical WGM resonator.

Figure 4A:
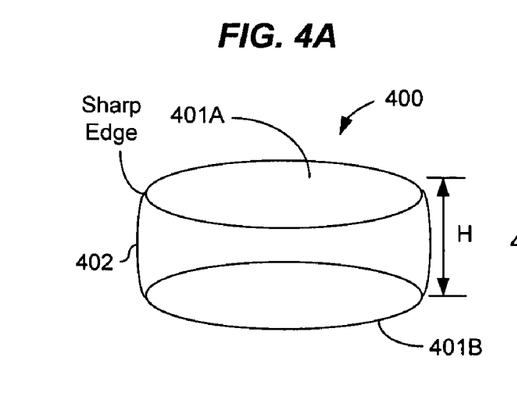
Figure 4B:
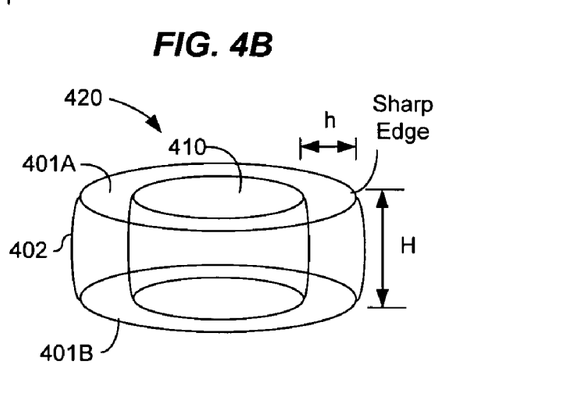

FIGS. 4A and 4B show a disk-shaped WGM resonator 400 and a ring-shaped WGM resonator 420, respectively. In FIG. 4A, the solid disk 400 has a top surface 401A above the center plane 102 and a bottom surface 401B below the plane 102 with a distance H. The value of the distance H is sufficiently large to support the WG modes. Beyond this sufficient distance above the center plane 102, the resonator may have sharp edges as illustrated in FIGS. 3, 4A, and 4B. The exterior curved surface 402 can be selected from any of the shapes shown in FIGS. 1, 2, and 3 to achieve desired WG modes and spectral properties. The ring resonator 420 in FIG. 4B may be formed by removing a center portion 410 from the solid disk 400 in FIG. 4A. Since the WG modes are present near the exterior part of the ring 420 near the exterior surface 402, the thickness h of the ring may be set to be sufficiently large to support the WG modes.

Figure 5A:
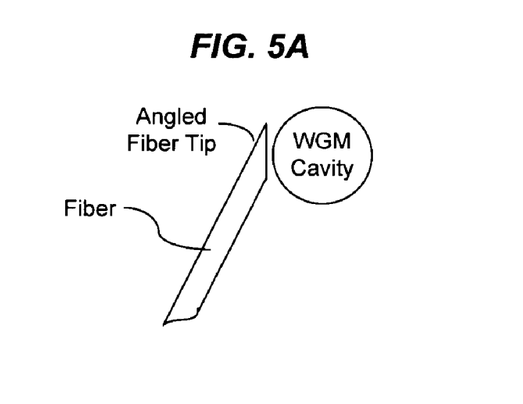
FIGS. 5A and 5B illustrate two evanescent coupling examples.
Figure 5B:
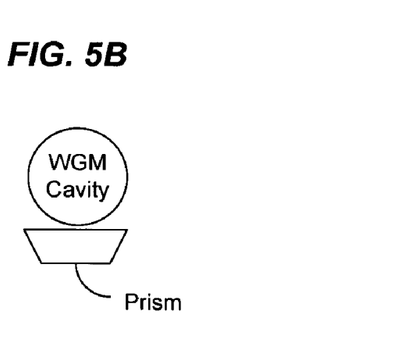

An optical coupler is generally used to couple optical energy into or out of the WGM resonator by evanescent coupling. FIGS. 5A and 5B show two exemplary optical couplers engaged to a WGM resonator. The optical coupler may be in direct contact with or separated by a gap from the exterior surface of the resonator to effectuate the desired critical coupling. FIG. 5A shows an angle-polished fiber tip as a coupler for the WGM resonator. A waveguide with an angled end facet, such as a planar waveguide or other waveguide, may also be used as the coupler. FIG. 5B shows a micro prism as a coupler for the WGM resonator. Other evanescent couplers may also be used, such as a coupler formed from a photonic bandgap material.

WGM resonators have proven to be an effective way to confine photons in small volumes for long periods of time. As such it has a wide range of applications in both fundamental studies and practical devices. For example, WGM resonators can be used for storage of light with linear optics, as an alternative to atomic light storage, as well as in tunable optical delay lines, a substitute for atomic-based slow light experiments. WGM resonators can also be used for optical filtering and opto-electronic oscillators, among other applications.

Amongst many parameters that characterize a WGM resonator (such as efficiency of in and out coupling, mode volume, free spectral range, etc.) the quality factor (Q) is a basic one. The Q factor is related to the lifetime of light energy in the resonator mode ($\tau$) as $Q=2\pi\nu\tau$, where $\nu$ is the linear frequency of the mode. The ring down time corresponding to a mode with $Q=2\times10^{10}$ and wavelength $\lambda=1.3$ μm is 15 μs, thus making ultrahigh Q resonators potentially attractive as light storage devices. Furthermore, some crystals are transparent enough to allow extremely high-Q whispering gallery modes while having important nonlinear properties to allow continuous manipulation of the WGMs' characteristics and further extend their usefulness.

In a dielectric resonator, the maximum quality factor cannot exceed $Q_{max}=2\pi n_0/(\pi\alpha)$, where $n_0$ is the refractive index of the material, $\lambda$ is the wavelength of the light in vacuum, and $\alpha$ is the absorption coefficient of the dielectric material. The smaller the absorption, the larger is $Q_{max}$. Hence, to predict the narrowest possible linewidth $\gamma=\tau^{-1}$ of a WGM one has to know the value of optical attenuation in transparent dielectrics—within their transparency window—within which the losses are considered negligible for the vast majority of applications. This question about the residual fundamental absorption has remained unanswered for most materials because of a lack of measurement methods with adequate sensitivity. Fortunately, high-Q whispering gallery modes themselves represent a unique tool to measure very small optical attenuations in a variety of transparent materials.

Previous experiments with WGM resonators fabricated by thermal reflow methods applicable to amorphous materials resulted in Q factors less than $9\times10^9$. The measurements were performed with fused silica microcavities, where surface-tension forces produced nearly perfect resonator surfaces, yielding a measured Q factor that approached the fundamental limit determined by the material absorption. It is expected that optical crystals would have less loss than fused silica because crystals theoretically have a perfect lattice without inclusions and inhomogeneities that are always present in amorphous materials. The window of transparency for many crystalline materials is much wider than that of fused silica. Therefore, with sufficiently high-purity material, much smaller attenuation in the middle of the transparency window can be expected-as both the Rayleigh scattering edge and multiphonon absorption edge are pushed further apart towards ultraviolet and infrared regions, respectively. Moreover, crystals may suffer less, or not at all, the extrinsic absorption effects caused by chemosorption of OH ions and water, a reported limiting factor for the Q of fused silica near the bottom of its transparency window at 1.55 μm.

Until recently, one remaining problem with the realization of crystalline WGM resonators was the absence of a fabrication process that would yield nanometer-scale smoothness of spheroidal surfaces for elimination of surface scattering. Very recently this problem was solved. Mechanical optical polishing techniques have been used for fabricating ultrahigh-Q crystalline WGM resonators with Q approaching $10^9$. In this application, high quality factors ($Q=2\times10^{10}$) in WGM resonators fabricated with transparent crystals are further described.

Crystalline WGM resonators with kilohertz-range resonance bandwidths at the room temperature and high resonance contrast (50% and more) are promising for integration into high performance optical networks. Because of small modal volumes and extremely narrow single-photon resonances, a variety of low-threshold nonlinear effects can be observed in WGM resonators based on small broadband nonlinear susceptibilities. As an example, below we report the observation of thermo-optical instability in crystalline resonators, reported earlier for much smaller volume high-Q silica microspheres.

There is little consistent experimental data on small optical attenuation within transparency windows of optical crystals. For example, the high sensitivity measurement of the minimum absorption of specially prepared fused silica, $\alpha=0.2$ dB/km at λ=1.55 μm, (Δα≳$10^{-7}$ cm$^{-1}$) becomes possible only because of kilometers of optical fibers fabricated from the material. Unfortunately, this method is not applicable to crystalline materials. Fibers have also been grown out of crystals such as sapphire, but attenuation in those (few dB per meter) was determined by scattering of their surface. Calorimetry methods for measurement of light absorption in transparent dielectrics give an error on the order of Δα≳$10^{-7}$ cm$^{-1}$. Several transparent materials have been tested for their residual absorption with calorimetric methods, while others have been characterized by direct scattering experiments, both yielding values at the level of a few ppm/cm of linear attenuation, which corresponds to the Q limitation at the level of $10^{10}$. The question is if this is a fundamental limit or the measurement results were limited by the imperfection of crystals used.

Selection of material for highest-Q WGM resonators must be based on fundamental factors, such as the widest transparency window, high-purity grade, and environmental stability. Alkali halides have to be rejected based on their hygroscopic property and sensitivity to atmospheric humidity. Bulk losses in solid transparent materials can be approximated with the phenomenological dependence $$\alpha \approx \alpha_{UV} e^{\lambda_{UV}/\lambda} + \alpha_R \lambda^{-4} + \alpha_{IR} e^{-\lambda_{IR}/\lambda}, \quad (1)$$

where $\alpha_{UV}$, $\alpha_R$, and $\alpha_{IR}$ represent the blue wing (primary electronic), Rayleigh, and red wing (multiphonon) losses of the light, respectively; $\lambda_{UV}$, and $\lambda_{IR}$ stand for the edges of the material transparency window. This expression does not take into account resonant absorption due to possible crystal impurities. Unfortunately, coefficients in Eq. (1) are not always known.

One of the most attractive candidates for fabrication of high-Q WGM resonators is calcium fluoride ($CaF_2$). It has attracted a lot of attention because of its use in ultraviolet lithography applications at 193 and 157 nm. Ultrapure crystals of this material suitable for wide aperture optics have been grown, and are commercially available. According to recently reported measurements on scattering in $CaF_2$ α=3×$10^{-5}$ cm$^{-1}$ at 193 nm, extremely small scattering can be projected in the near-infrared band corresponding to the limitation of Q at the level of $10^{13}$.

Figure 6:
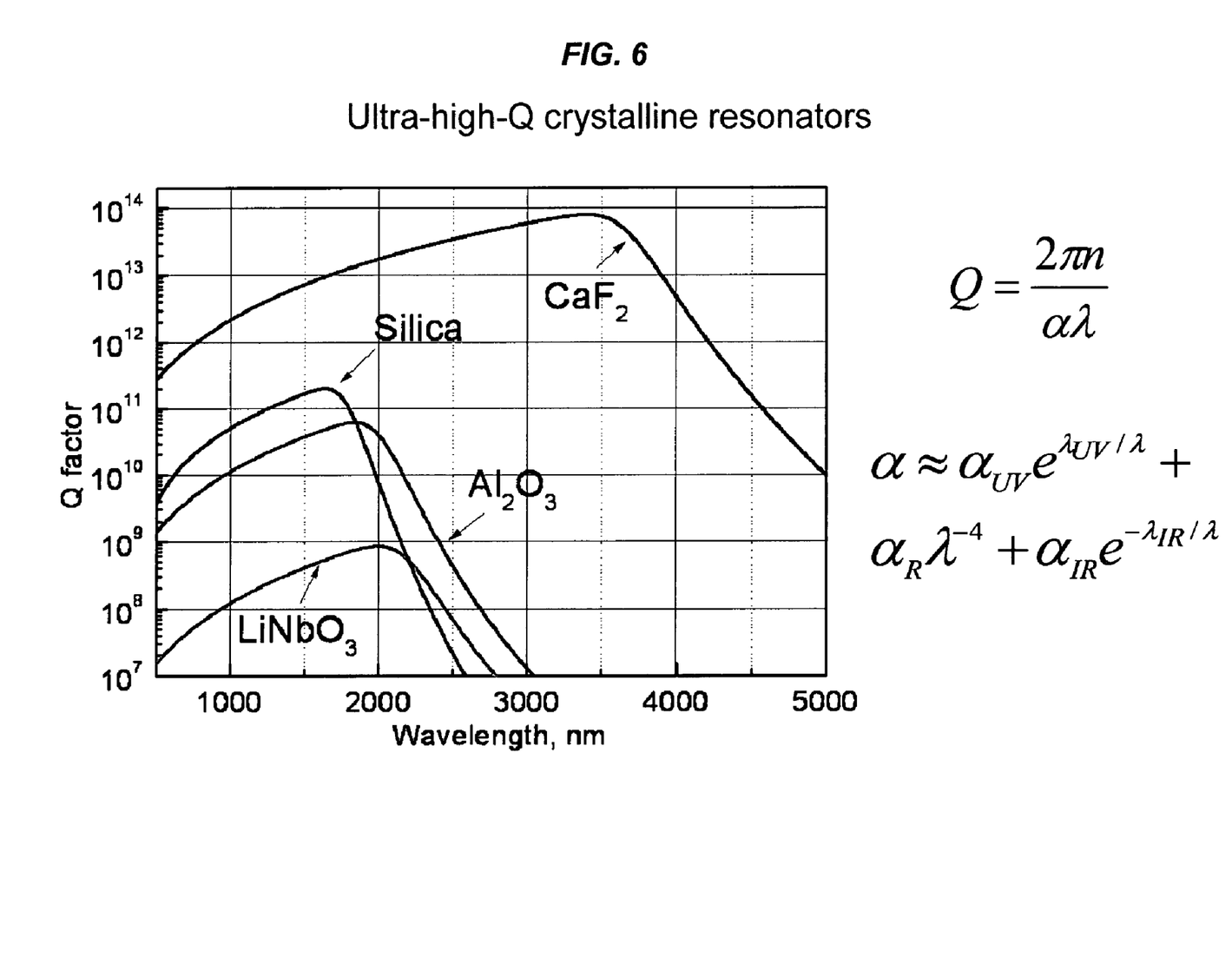
FIGS. 6, 7, 8, 9, 10 and 11 show properties of crystal WGM resonators.

FIG. 6 shows the projected limitations of the Q factors for crystalline WGM resonators by bulk material attenuation. The dependencies shown are not fundamental theoretical limits but represent wavelength extrapolations based on semi-phenomenological model Eq. (1) and the best experimental fragmentary data on absorption and scattering ($CaF_2$), $Al_2O_3$, fused silica and $LiNbO_3$.

Lattice absorption at this wavelength can be predicted from the position of the middle infrared multiphonon edge, and yields even smaller Q limitations. Because of residual doping and nonstoichiometry, both scattering and absorption will be elevated compared to the fundamental limits, thereby reducing the Q in actual resonators. An additional source for Q limitation may be the scattering produced by the residual surface inhomogeneities resulting from the polishing techniques. At the limit of conventional optical polishing quality (average roughness σ=2 nm), the estimates based on the waveguide model for WGM surface scattering yield Q≅$10^{11}$.

Figure 7:
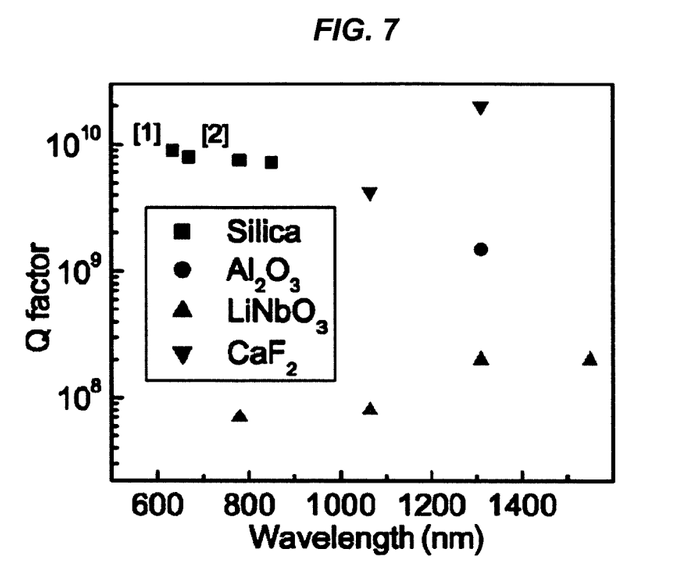
Figure 8:
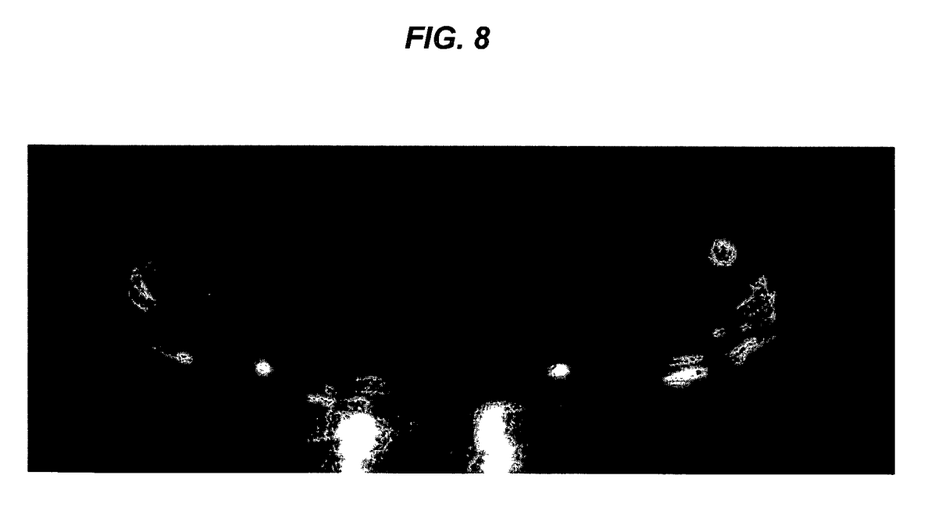

We studied WGM resonators fabricated with calcium fluoride and a few other crystalline materials, and measured their quality factors. The highest achieved Q values are presented in FIG. 7 which shows the maximum Q factors achieved with crystalline resonators vs the best Q factors measure in the fused silica microspheres: (1) Ref.; (2) Ref. $LiTaO_3$ resonators have the same Qs as $LiNbO_3$. The $LiNbO_3$, $LiTaO_3$ and $Al_2O_3$ resonators were fabricated out of commercially available wafers. $CaF_2$ resonators were fabricated out of commercial windows. The fabrication was performed by core-drilling of cylindrical preforms and subsequent polishing of the rim of the preforms into spheroidal geometry. The typical resonator has a diameter of 4-7 millimeters and a thickness of 0.5-1 mm. FIG. 8 shows Calcium fluoride resonators that have Q=2×$10^{10}$.

We tested resonators made with several varieties of lithium niobate, which included congruent, stoichiometric, and periodically poled materials, and were able to achieve the maximum Q at the same level in all cases.

Measurement of the Q was done using the prism coupling method. The intrinsic Q was measured from the bandwidth of the observed resonances in the undercoupled regime. Because of different refraction indices in resonators, we used BK7 glass prisms (n=1.52) for silica (n=1.44) and calcium fluoride (n=1.43), diamond (n=2.36) for lithium niobate (n=2.10, 2.20), and lithium niobate prism (n=2.10) for sapphire (n=1.75). We used extended cavity diode lasers at 760 nm, distributed feedback semiconductor lasers at 1550 nm, and solid-state YAG lasers at 1319 nm as the light source.

Figure 9:
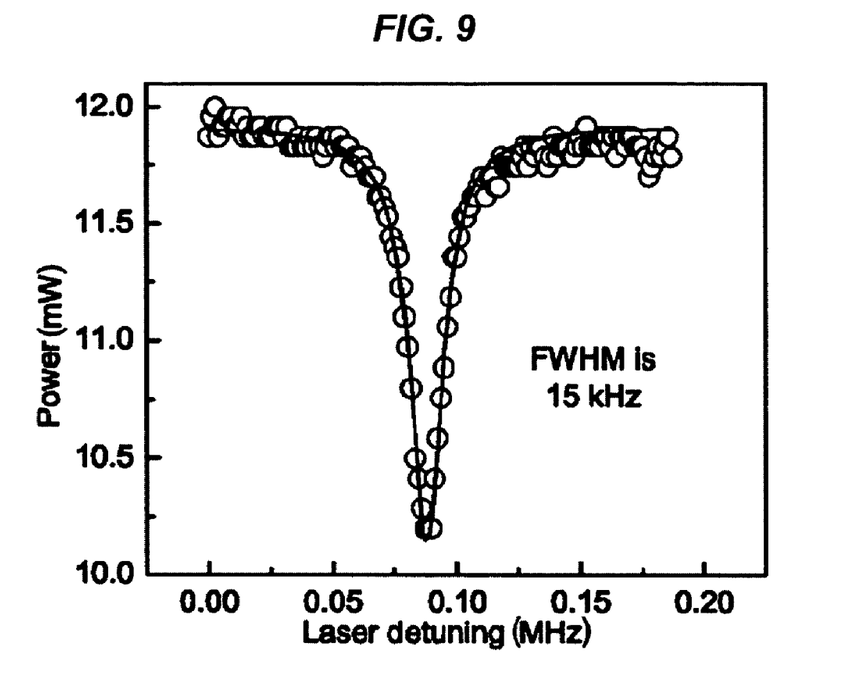
Figure 10:
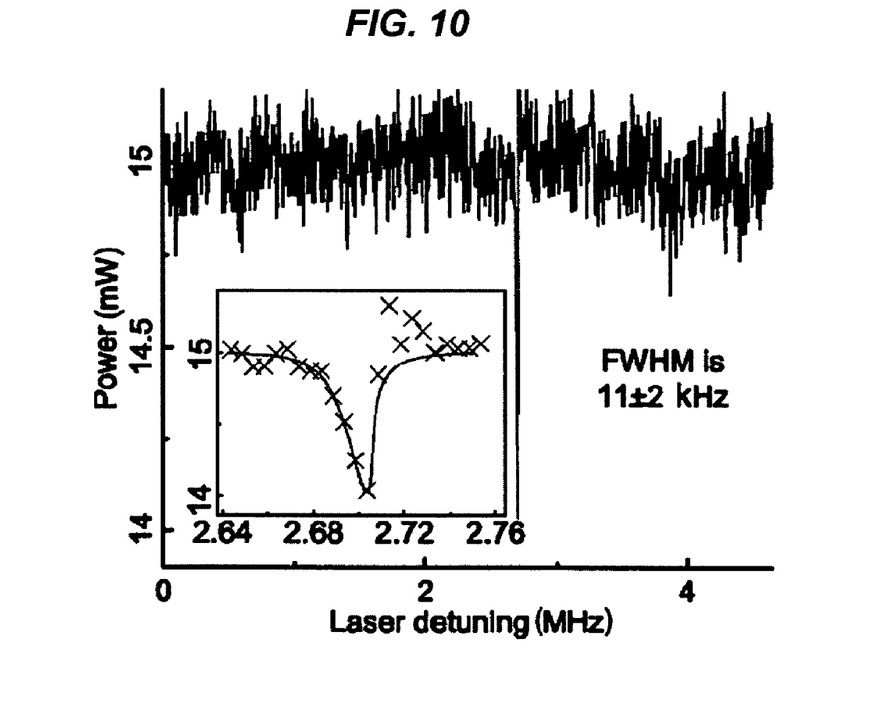

FIG. 9 shows one example of a measured resonance curve of a sample WGM resonator made of calcium fluoride. The experimental data are well fitted with the Lorentz curve having 15-kHz full width at half maximum (FWHM). By improving the quality of the polishing, the Q factor can be further increased beyond what was measured. However, with this increase, the laser line-width becomes comparable to the width of the resonance, and thermal nonlinearity becomes significant. Furthermore, the resonance can no longer be fitted with a Lorentzian function any more. FIG. 10 shows a spectrum of $CaF_2$ WGM resonator with a Q factor exceeding 2×$10^{10}$ (α=5×$10^{-6}$ cm$^{-1}$). The insert in FIG. 10 shows the resonance fitted with a theoretically derived resonance curve, where the theory takes into consideration the thermal nonlinearity of the material.

Thermal nonlinearity is important in high-Q WGM resonators. For example, because of the thermal non-linearity, the trace of the resonance on the screen of oscilloscope changes depending on the laser power and the speed and direction of the laser scan. This effect is produced because of heating of the mode volume by the light power absorbed in the material resulting from the nonzero optical absorption. The process can be described with two time constants, one of which is responsible for flow of heat from the mode volume to the rest of the resonator, and the other for heat exchange between the resonator and external environment. The laser scan should be fast compared with the relaxation constants and the light power must be small to reduce the effect.

In the simplest approximation the evolution of the system can be described with a set of two equations, where a is the complex amplitude of the field in the resonator mode, γ is the mode linewidth, ω=2πτ is the mode frequency, δ is the thermal frequency shift, F(t) stands for the external pump, Γ characterizes the thermal relaxation rate, and ξ is the thermal nonlinearity coefficient. Numerical simulations show the presence of instability in the system originally observed in fused silica microresonators. The regime of the oscillatory instability is observed in the crystal-line resonators as well.

Figure 11:
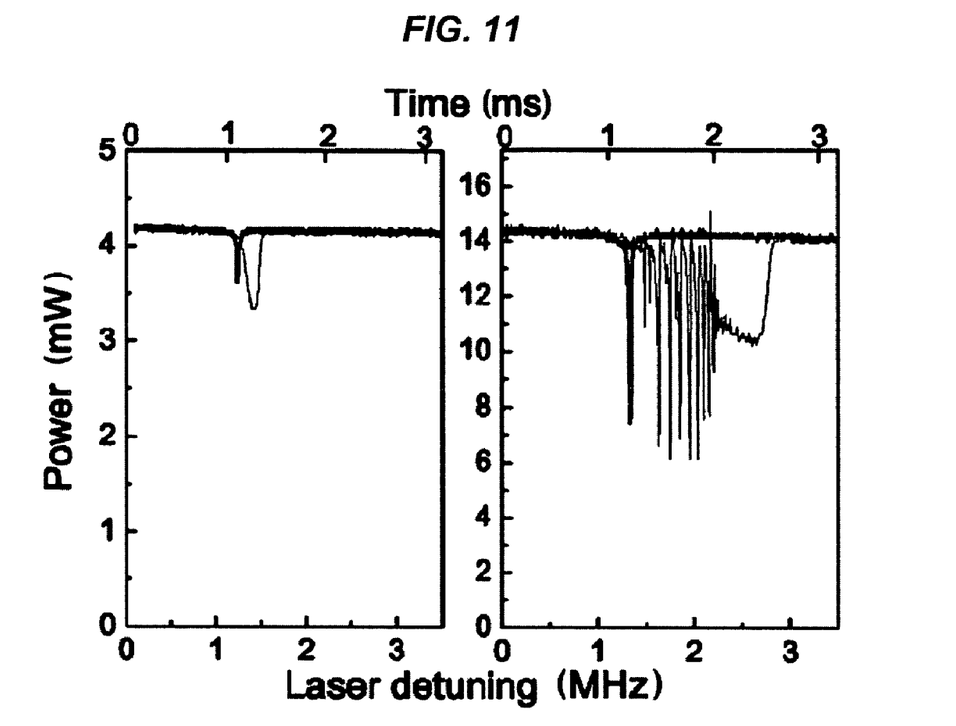

FIG. 11 shows the interlaced resonance curves as scanned in two different laser frequency sweep directions. The hysteretic feature occurs due to thermal oscillatory instability of the slope of the nonlinear resonant curve. Heating of the resonator shifts the mode to higher frequency. The laser drags the mode if the laser frequency increases slowly with time. On the other hand, the laser jumps through the mode if the laser frequency decreases with time. The effect increases with the increase of optical power in the mode (cf. left- and right-hand side traces). The quality factor of the mode exceeds $6 \times 10^9$.

In view of the above, we have presented results concerning the fabrication of very high-Q whispering gallery mode crystal-line resonators, and demonstrated the highest reported Q factor in a dielectric WGM optical cavity. We show that it is possible to produce such resonators with Q factors exceeding the maximal Q factors of fused silica resonators. Our measurements have shown that some optical crystals have lower absorption in the near infrared, as compared with data reported previously. Ultrahigh-Q crystalline whispering gallery mode resonators pave the way for further understanding the interaction of light with matter, and could be useful in many fundamental science and engineering applications, including ultra-narrow-band filters and light storage devices with flexibility to contain light for long intervals of time.

The following sections further describe one application of the above high-Q fluorite WGM resonators for achieving low-threshold optical hyperparametric oscillations. The oscillations result from the resonantly enhanced four-wave mixing occurring due to Kerr nonlinearity of the material. Because of the narrow bandwidth of the resonator modes as well as the high efficiency of the resonant frequency conversion, the oscillations produce stable narrow-band beat-note of the pump, signal, and idler waves. A theoretical model for this process is described.

Realization of efficient nonlinear optical interactions at low light levels has been one of the main goals of non-linear optics since its inception. Optical resonators contribute significantly to achieving this goal, because confining light in a small volume for a long period of time leads to increased nonlinear optical interactions. Optical whispering gallery mode (WGM) resonators are particularly well suited for the purpose. Features of high quality factors (Q) and small mode volumes have already led to the observation of low-threshold lasing as well as efficient nonlinear wave mixing in WGM resonators made of amorphous materials.

Optical hyperparametric oscillations, dubbed as modulation instability in fiber optics, usually are hindered by small nonlinearity of the materials, so high-power light pulses are required for their observation. Though the nonlinearity of $CaF_2$ is even smaller than that of fused silica, we were able to observe with low-power continuous wave pump light a strong nonlinear interaction among resonator modes resulting from the high Q ($Q > 5 \times 10^9$) of the resonator. New fields are generated due to this interaction.

The frequency of the microwave signal produced by mixing the pump and the generated side-bands on a fast photo-diode is very stable and does not experience a frequency shift that could occur due to the self- and cross-phase modulation effects. Conversely in, e.g., coherent atomic media, the oscillations frequency shifts to compensate for the frequency mismatch due to the cross-phase modulation effect (ac Stark shift). In our system the oscillation frequency is given by the mode structure and, therefore, can be tuned by changing the resonator dimensions. In contrast with resonators fabricated with amorphous materials and liquids, high-Q crystalline resonators allow for a better discrimination of the third-order nonlinear processes and the observation of pure hyperparametric oscillation signals. As a result, the hyperoscillator is promising for applications as an all-optical secondary frequency reference.

The hyperparametric oscillations could be masked with stimulated Raman scattering (SRS) and other non-linear effects. For example, an observation of secondary lines in the vicinity of the optical pumping line in the SRS experiments with WGM silica microresonators was interpreted as four-wave mixing between the pump and two Raman waves generated in the resonator, rather than as the four-photon parametric process based on electronic Kerr nonlinearity of the medium. An interplay among various stimulated nonlinear processes has also been observed and studied in droplet spherical microcavities.

The polarization selection rules together with WGM's geometrical selection rules allow for the observation of nonlinear processes occurring solely due to the electronic nonlinearity of the crystals in crystalline WGM resonators. Let us consider a fluorite WGM resonator possessing cylindrical symmetry with symmetry axis. The linear index of refraction in a cubic crystal is uniform and isotropic, therefore the usual description of the modes is valid for the resonator. The TE and TM families of WGMs have polarization directions parallel and orthogonal to the symmetry axis, respectively. If an optical pumping light is sent into a TE mode, the Raman signal cannot be generated in the same mode family because in a cubic crystal such as $CaF_2$ there is only one, triply degenerate, Raman-active vibration with symmetry $F_{2g}$. Finally, in the ultrahigh Q crystalline resonators, due to the material as well as geometrical dispersion, the value of the free spectral range (FSR) at Raman detuning differs from the FSR at the carrier frequency by an amount exceeding the mode spectral width. Hence, frequency mixing between the Raman signal and the carrier is strongly suppressed. Any field generation in the TE mode family is due to the electronic nonlinearity only, and Raman scattering occurs in the TM modes.

Figure 12:
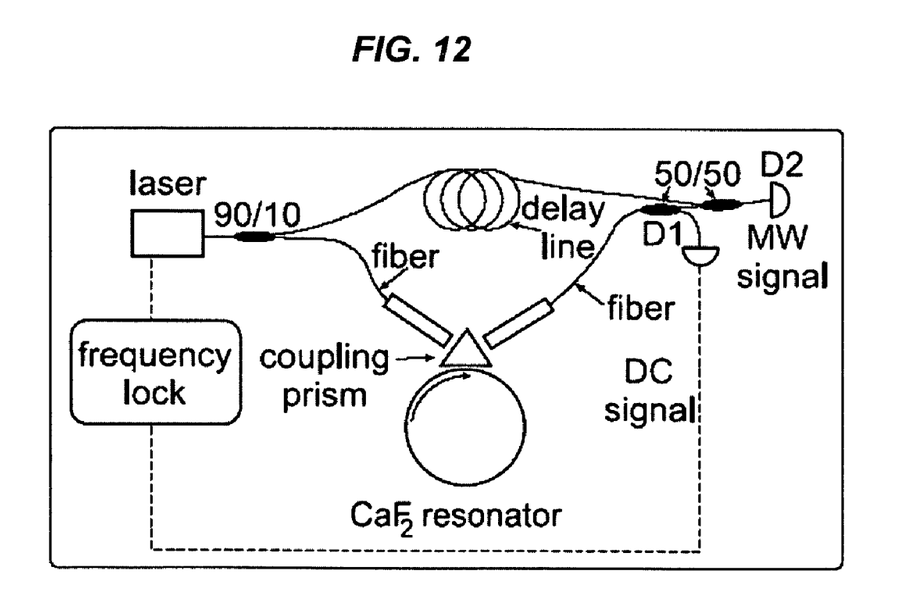
FIG. 12 shows a device for measuring an optical hyperparametric oscillation in a fluorite WGM resonator in Mach-Zehnder configuration.

FIG. 12 shows an example of a device for generating the nonlinear oscillations in a $CaF_2$ WGM resonator. Light from a 1.32 μm YAG laser is sent into a $CaF_2$ WGM resonator with a glass coupling prism. The laser linewidth is less than 5 kHz. The maximum coupling efficiency is better than 50%. A typical $CaF_2$ resonator has a toroidal shape with a diameter of several millimeters and thickness in the range of several hundred microns. The resonators Q factors are on the order of $10^9$-$10^{10}$.

The output light of the resonator is collected into a single-mode fiber after the coupling prism, and is split into two equal parts with a 50/50 fiber splitter. One output of the splitter is sent to a slow photodiode D1 that produces a dc signal used for locking the laser to a particular resonator's mode. The other output is mixed with a delayed laser light that has not interacted with the resonator, and the mixed signal is directed to fast photo-diode D2. With this configuration the disc resonator is placed into an arm of a tunable Mach-Zehnder interferometer. If the delay between the interferometer arms is correctly chosen we observe a narrow-band microwave signal emitted by the photodiode.

The locking loop enables us to inject a desired amount of optical power into the resonator, which would be difficult otherwise because the resonator spectrum can drift due to thermal and Kerr effects. The larger the laser power, the further do the modes shift, reducing total power accumulation in the resonator. For instance, thermal dependence of the index of refraction for $CaF_2$ is $$\beta = n_0^{-1} \partial n / \partial T \approx -10^{-5}/K$$

This means that the frequency of a WGM mode $\omega_m$ increases by $10^{-5} \omega_m$ if the temperature T increases by 1° Kelvin (follows from $\omega_m \approx mc/Rn_o(1+\beta)$, where c is the speed of light in the vacuum, m>>1 is the mode number, R is the radius of the resonator, and $n_o$ is the index of refraction). Such a shift is 4 orders of magnitude larger than the width of the resonance if $Q=10^9$. The feedback loop compensates for this shift by adjusting the laser frequency to keep up with the mode. The stationary mode frequency is determined by the amount of the optical power absorbed in the resonator as well as by the heat exchange of the cavity with the external environment.

Figure 15:
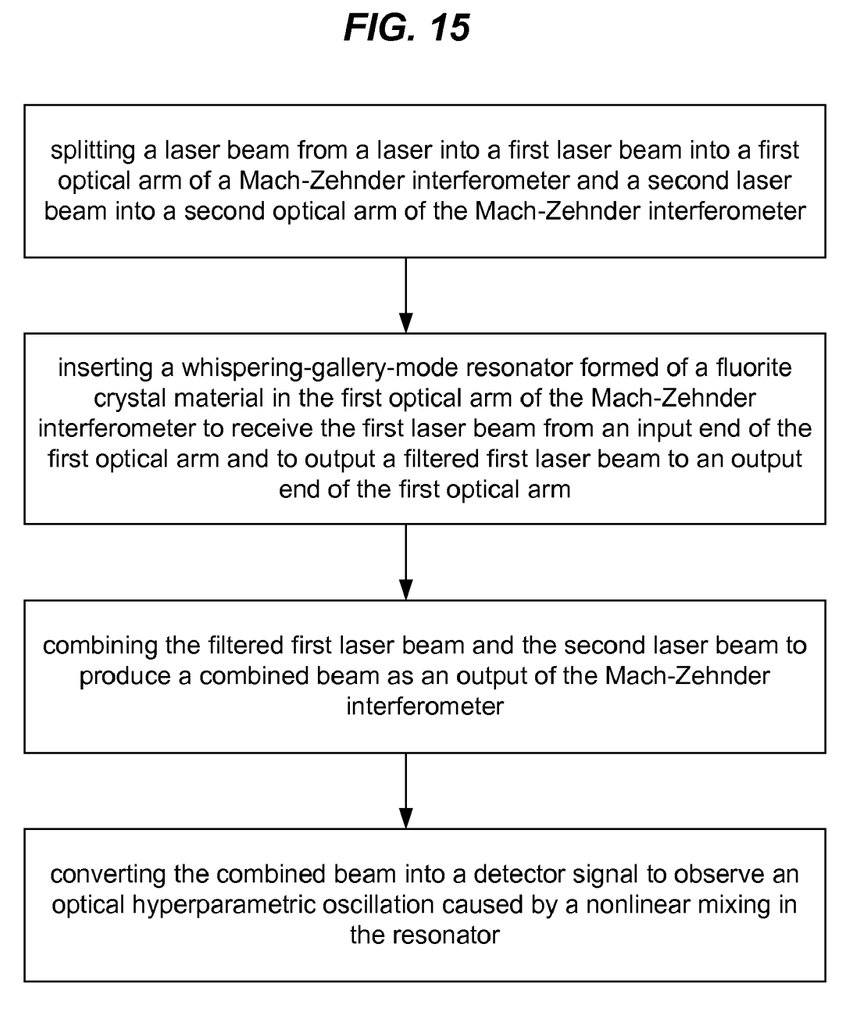
FIGS. 15 and 16 show two methods of operating the device in FIG. 12.
Figure 16:
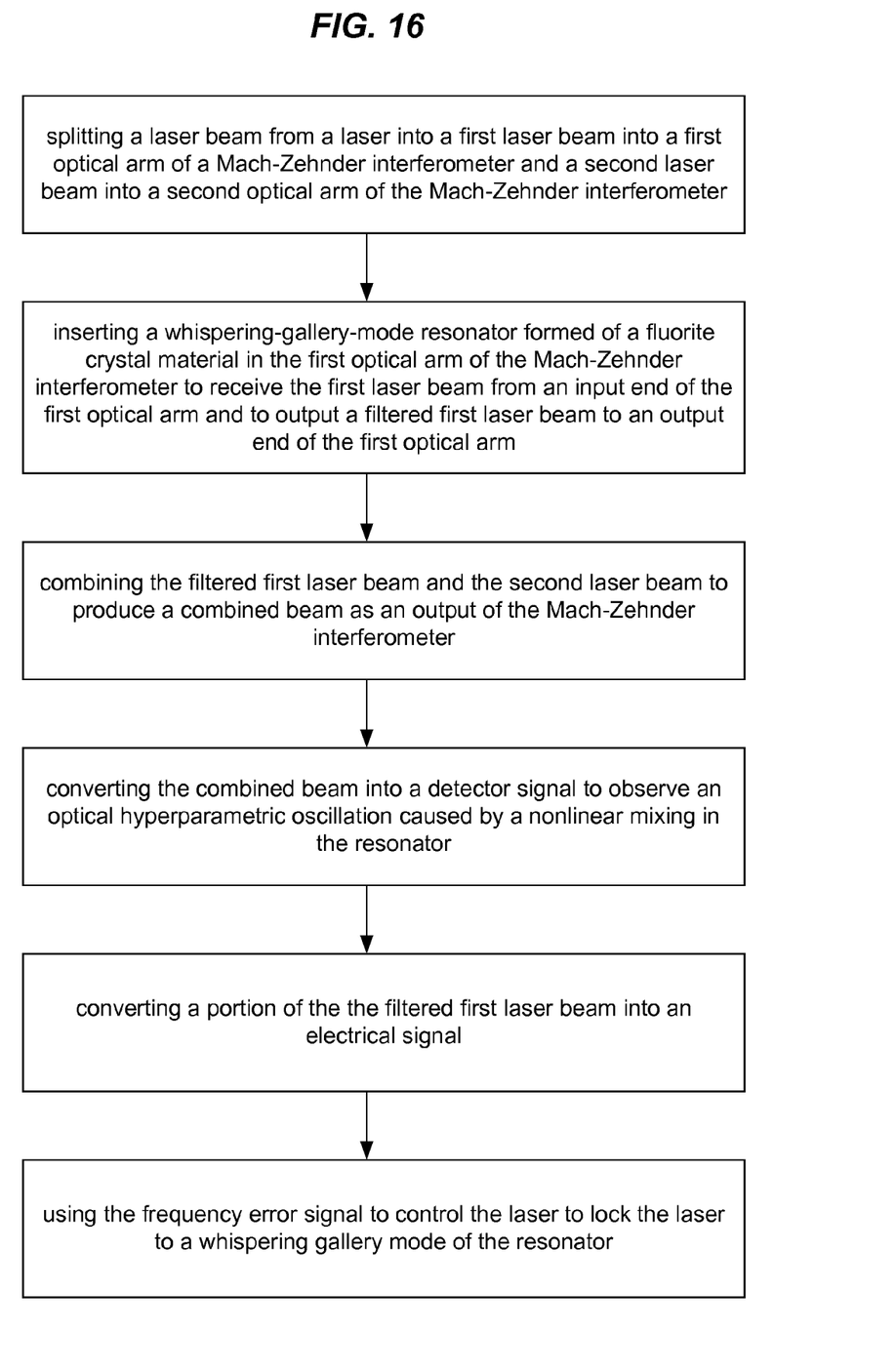

We found that if the light from the resonator is directly sent to a fast photodiode it would not generate any detectable microwave signal. However, if the resonator is placed into an arm of the Mach-Zehnder interferometer and the delay in the second arm of the interferometer is correctly chosen, the modulation appears. This is a distinctive property of phase modulated light. The observed phase modulation implies that high- and low-frequency sidebands generated in the parametric oscillation process have a π radian phase relationship, while the hyperparametric oscillations observed in optical fibers generally result in π/2 phase between the sidebands. FIGS. 15 and 16 show two methods of operating the device in FIG. 12.

Figure 13:
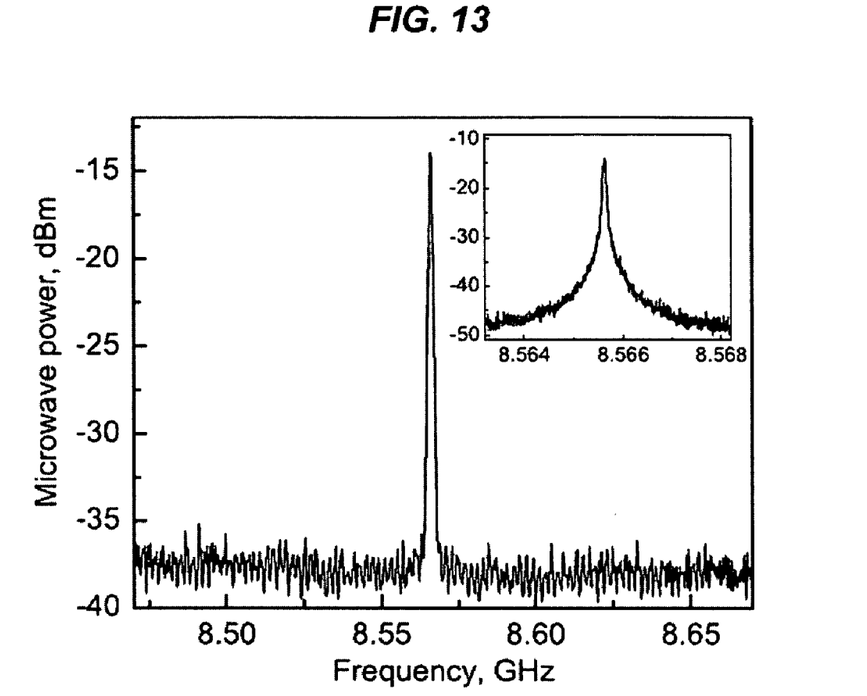
FIGS. 13 and 14 show measurements from the device in FIG. 12.

FIG. 13 shows one example of a microwave spectrum of a 22-dB amplified microwave signal generated at the broadband optical detector by the light interacted with a $CaF_2$ resonator. The microwave frequency corresponds to FSR of the resonator. The half width at half maximum of the signal shown is less than 40 kHz. The generated microwave signal with the frequency ~8 GHz corresponding to the FSR of the resonator has a narrow (≦40 kHz) linewidth. We found that the signal frequency is stable with temperature, pump power, and coupling changes, because the FSR frequency of the resonator does not significantly change with any of those parameters.

Figure 14:
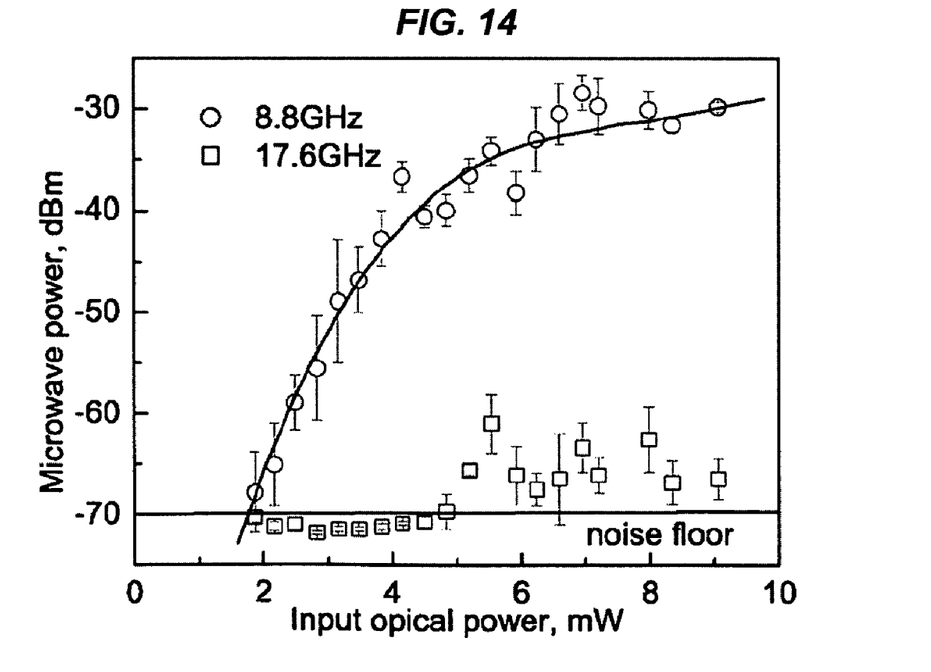

FIG. 14 shows measured values of the microwave power as a function of the optical pump power. This measurement is used to find the efficiency of the parametric process. The plot shows the microwave power at the output of the optical detector versus 1.32 μm pumping light power. The microwave frequency corresponds to the $\delta_{FSR}$ of the WGM disc resonator. The solid line is a guide for the eye. Circles and squares are for the first and second mw harmonics of the signal. The modulation appears only after exceeding a distinct power threshold (~1 mW) for the optical pump. We estimated the modulation efficiency to be ~7% between a sideband power and the pump power achieved at 4 mW input optical power. Increasing the pumping power results in a gradual decrease of the sideband power because of the generation of higher harmonics.

We also searched for the SRS process in the resonator. To collect all output light from the TE as well as the TM modes we used a multimode optical fiber instead of the single-mode fiber at the output of the prism coupler. The fiber was connected to an optical spectrum analyzer. The SRS signal was expected in the vicinity of the $CaF_2$ Raman-active phonon mode (322 $cm^{-1}$). Within the range of accuracy of our measurement setup and with optical pumping as high as 10 mW at the resonator entrance, we were unable to observe any SRS signals, in contrast with the previous studies of nonlinear phenomena in amorphous WGM resonators. We conclude that the modulation effect is due to the hyperparametric oscillations, not a four-wave mixing between the optical pumping and light generated due to the Raman scattering.

To explain the results of our experiment we consider three cavity modes: one nearly resonant with the pump laser and the other two nearly resonant with the generated optical sidebands. We begin with the following equations for the slow amplitudes of the intracavity fields $$\dot{A}=-\Gamma_o A+ig[|A|^2+2|B_+|^2+2|B_-|^2]A+2igA^*B_+B_-+F_0,$$

$$\dot{B}_+=-\Gamma_+ B_+ +ig[2|A|^2+|B_+|^2+2|B_-|^2]B_+ +igB^*_- |A|^2,$$

$$\dot{B}_-=-\Gamma_- B_- +ig[2|A|^2+2|B_+|^2+|B_-|^2]B_- +igB^*_+ |A|^2,$$

where $\Gamma_o=i(\omega_o-\omega)+\gamma_o$ and $\Gamma_\pm=i(\omega_\pm-\tilde{\omega}_\pm)+\gamma_\pm$, $\gamma_o$, $\gamma_+$, and $\gamma_-$ as well as $\omega_o$, $\omega_+$, and $\omega_-$ are the decay rates and eigenfrequencies of the optical cavity modes respectively; ω is the carrier frequency of the external pump (A), $\tilde{\omega}_\pm$ and $\tilde{\omega}_\pm$ are the carrier frequencies of generated light ($B_+$ and $B_-$, respectively). These frequencies are determined by the oscillation process and cannot be controlled from the outside. However, there is a relation between them (energy conservation law): $2\omega=\tilde{\omega}_++\tilde{\omega}_-$. Dimensionless slowly varying amplitudes A, $B_+$, and $B_-$ are normalized such that $|A|^2$, $|B_+|^2$, and $|B_-|^2$ describe photon number in the corresponding modes. The coupling constant can be found from the following expression $$g=\hbar\omega_0^2 n_2 c/Vn_0^2$$

where $n_2$ is an optical constant that characterizes the strength of the optical nonlinearity, $n_o$ is the linear refractive index of the material, V is the mode volume, and c is the speed of light in the vacuum. Deriving this coupling constant we assume that the modes are nearly overlapped geometrically, which is true if the frequency difference between them is small. The force $F_o$ stands for the external pumping of the system $F_o=(2\gamma_o P_o/\omega_o)^{1/2}$, where $P_o$ is the pump power of the mode applied from the outside.

For the sake of simplicity we assume that the modes are identical, i.e., $\gamma_+=\gamma_-=\gamma_o$, which is justified by observation with actual resonators. Then, solving the set (1)-(3) in steady state we find the oscillation frequency for generated fields $$\omega - \tilde{\omega}_- = \tilde{\omega}_+ - \omega = \frac{1}{2}(\omega_+ - \omega_-),$$

i.e., the beat-note frequency depends solely on the frequency difference between the resonator modes and does not depend on the light power or the laser detuning from the pumping mode. As a consequence, the electronic frequency lock circuit changes the carrier frequency of the pump laser but does not change the frequency of the beat note of the pumping laser and the generated sidebands.

The threshold optical power can be found from the steady state solution of the set of three equations for the slow amplitudes of the intracavity fields:

$$P_{th} \simeq 1.54 \frac{\pi}{2} \frac{n_0^2 V}{n_2 \lambda Q^2},$$

where the numerical factor 1.54 comes from the influence of the self-phase modulation effects on the oscillation threshold. The theoretical value for threshold in our experiment is $P_{th}\approx 0.3$ mW, where $n_o=1.44$ is the refractive index of the material, $n_2=3.2\times10^{-16}$ $cm^2/W$ is the nonlinearity coefficient for calcium fluoride, $V=10^{-4}$ $cm^3$ is the mode volume, $Q=6\times10^9$, and $\lambda=1.32$ μm.

The above equation suggests that the efficiency of the parametric process increases with a decrease of the mode volume. We used a relatively large WGM resonator because of the fabrication convenience. Reducing the size of the resonator could result in a dramatic reduction of the threshold for the oscillation. Since the mode volume may be roughly estimated as $V=2\pi\lambda R^2$, it is clear that reducing the radius R by an order of magnitude would result in 2 orders of magnitude reduction in the threshold of the parametric process. This could place WGM resonators in the same class as the oscillators based on atomic coherence. However, unlike the frequency difference between sidebands in the atomic oscillator, the frequency of the WGM oscillator could be free from power (ac Stark) shifts.

Solving the set of Langevin equations describing quantum behavior of the system we found that the phase diffusion of the beat-note is small, similar to the low phase diffusion of the hyperparametric process in atomic coherent media. Close to the oscillation threshold the phase diffusion coefficient is $$D_{beat} \simeq \frac{\gamma_0^2}{4} \frac{\hbar\omega_0}{P_{B_{out}}},$$

where $P_{B_{out}}$ is the output power in a sideband. The corresponding Allan deviation is $\sigma_{beat}/\omega_{beat} = (2 D_{beat}/t\omega^2 beat)^{1/2}$. We could estimate the Allan deviation as follows:

$$\sigma_{beat}/\omega_{beat} \cong 10^{-13}/\sqrt{t}$$

for $\gamma_0 = 3\times 10^5$ rad/s, $P_{Bout} = 1$ mW, $\omega_0 = 1.4\times 10^{15}$ rad/s and $\omega_{beat} = 5\times 10^{10}$ rad/s. Follow up studies of the stability of the oscillations in the general case will be published elsewhere.

We considered only three interacting modes in the model, however the experiments show that a larger number of modes could participate in the process. The number of participating modes is determined by the variation of the mode spacing in the resonator. Generally, modes of a resonator are not equidistant because of the second order dispersion of the material and the geometrical dispersion. We introduce $D = (2\omega_o - \omega_+ - \omega_-)/\gamma_o$ to take the second order dispersion of the resonator into account. If $|D| \geq 1$ the modes are not equidistant and, therefore, multiple harmonic generation is impossible.

Geometrical dispersion for the main mode sequence of a WGM resonator is $D \cong 0.41c/(\gamma_o R n_0 m^{5/3})$, for a resonator with radius R; $\omega_+$, $w_0$, and $\omega_-$ are assumed to be m+1, m, and m−1 modes of the resonator ($\omega_m R n_{\omega m} = mc$, m>>1). For R=0.4 cm, $\gamma_0 = 2\times 10^5$ rad/s, m=3×10$^4$ we obtain D=7×10$^{-4}$, therefore the geometrical dispersion is relatively small in our case. However, the dispersion of the material is large enough. Using the Sellmeier dispersion equation, we find D≅0.1 at the pump laser wavelength. This implies that approximately three sideband pairs can be generated in the system (we see only two in the experiment).

Furthermore, the absence of the Raman signal in our experiments shows that effective Raman nonlinearity of the medium is lower than the value measured earlier. Theoretical estimates based on numbers from predict nearly equal pump power threshold values for both the Raman and the hyperparametric processes. Using the expression derived for SRS threshold $P_R \cong \pi 2 n_0^2 V/G\lambda^2 Q^2$, where $G \cong 2\times 10^{-11}$ cm/W is the Raman gain coefficient for $CaF_2$, we estimate $P_{th}/P_R \approx 1$ for any resonator made of $CaF_2$. However, as mentioned above, we did not observe any SRS signal in the experiment.

Therefore, because of the long interaction times of the pumping light with the material, even the small cubic nonlinearity of $CaF_2$ results in an efficient generation of narrow-band optical sidebands. This process can be used for the demonstration of a new kind of an all-optical frequency reference. Moreover, the oscillations are promising as a source of squeezed light because the sideband photon pairs generated in the hyperparametric processes are generally quantum correlated.

The various aspects of the above described technical features are described in two published articles by Savchenkov et al., "Kilohertz optical resonances indielectric crystal cavities," Physical Review A70, Rapid Communications, 052804 (R), 2004 and "Low threshold optical oscillations in a whispering gallery mode CaF2 resonator," Physical Review Letter, Vol. 93, 243905 (2004). The entire disclosures of above two articles are incorporated by reference as part of the specification of this application.

Only a few implementations are disclosed. Variations and enhancements may be made.

What is claimed is:

1. A method, comprising:
    splitting a laser beam from a laser into a first laser beam into a first optical arm of a Mach-Zehnder interferometer and a second laser beam into a second optical arm of the Mach-Zehnder interferometer;
    inserting a nonlinear whispering-gallery-mode (WGM) resonator formed of a fluorite crystal material exhibiting optical nonlinearities for nonlinear wave mixing in the first optical arm of the Mach-Zehnder interferometer to receive the first laser beam from an input end of the first optical arm and to output a filtered first laser beam to an output end of the first optical arm, wherein the whispering-gallery-mode resonator comprises at least a portion of a spheroid with an eccentricity larger than 0.1;
    controlling the laser beam entering the Mach-Zehnder interferometer by setting a power level of the first laser beam above a threshold and effectuating nonlinear wave mixing inside the WGM resonator, including suppressing light in the TM mode caused by Raman scattering and generating the nonlinear wavemixing in TE sets of whispering-gallery modes circulating along an equator of the spheroid around a short ellipsoid axis based on an electronic nonlinearity for the TE mode by controlling polarization of the laser beam to be parallel to a symmetric axis of the WGM resonator wherein the suppressing step occurs while the generating step occurs;
    combining the filtered first laser beam and the second laser beam to produce a combined optical beam as an output of the Mach-Zehnder interferometer;
    converting the combined optical beam into an electronic detector signal; and
    observing an optical hyperparametric oscillation caused by the nonlinear wave mixing in the WGM resonator.

2. A method as in claim 1, wherein the laser is a tunable laser, the method further comprising:
    converting a portion of the filtered first laser beam into an electrical signal;
    extracting a DC portion of the electrical signal as a frequency error signal of the laser; and
    applying the frequency error signal to control the laser to lock the laser to a whispering gallery mode of the resonator.

3. A method as in claim 1, comprising:
    placing an optical coupling element adjacent to the equator to evanescently couple optical energy into the WGM resonator in at least one of the whispering-gallery modes, or out of the WGM resonator from at least one of the whispering-gallery modes.

4. A method as in claim 1, wherein the fluorite crystal material is CaF2.

5. A method as in claim 1, comprising using a frequency generated by the nonlinear wave mixing to provide an optical frequency reference.

* * * * *

UNITED STATES PATENT AND TRADEMARK OFFICE
CERTIFICATE OF CORRECTION

PATENT NO. : 7,630,417 B1
APPLICATION NO. : 11/166355
DATED : December 8, 2009
INVENTOR(S) : Maleki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 208 days.

Signed and Sealed this

Twenty-first Day of December, 2010

David J. Kappos
*Director of the United States Patent and Trademark Office*